United States Patent
Kabuki et al.

(10) Patent No.: US 7,649,186 B2
(45) Date of Patent: Jan. 19, 2010

(54) EXTREME UV RADIATION FOCUSING MIRROR AND EXTREME UV RADIATION SOURCE DEVICE

(75) Inventors: Kiyoyuki Kabuki, Himeji (JP); Hiroto Sato, Gotenba (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 93 days.

(21) Appl. No.: 11/736,866

(22) Filed: Apr. 18, 2007

(65) Prior Publication Data

US 2008/0121824 A1 May 29, 2008

(30) Foreign Application Priority Data

Apr. 18, 2006 (JP) .............................. 2006-114219

(51) Int. Cl.
*H05G 2/00* (2006.01)
*G21G 4/00* (2006.01)
(52) U.S. Cl. ................ 250/492.2; 250/461.1; 250/493.1
(58) Field of Classification Search .............. 250/492.2, 250/493.1
See application file for complete search history.

(56) References Cited

U.S. PATENT DOCUMENTS

| 6,359,969 | B1 | 3/2002 | Shmaenok |
| 6,859,259 | B2 | 2/2005 | Bakker et al. |
| 6,894,298 | B2 | 5/2005 | Ahmad et al. |
| 7,084,412 | B2 * | 8/2006 | Weiss ...................... 250/492.2 |
| 7,088,424 | B2 | 8/2006 | Bakker et al. |
| 7,145,637 | B2 | 12/2006 | Singer |
| 7,329,014 | B2 * | 2/2008 | Balogh et al. ................ 359/845 |
| 2005/0094764 | A1 * | 5/2005 | Weiss ........................... 378/34 |
| 2006/0163500 | A1 * | 7/2006 | Inoue et al. .............. 250/493.1 |

FOREIGN PATENT DOCUMENTS

| JP | 2005-310922 A | 11/2005 |
| JP | 2006-19510 A | 1/2006 |

OTHER PUBLICATIONS

Present Status and Future of EUV (Extreme Ultra Violet) Light Source Research, J. Plasma Fusion Res., vol. 79, No. 3; 1) 2. EUV Lithography and Exposure Tool, Murakami et al., pp. 221-225; English Abstract; 2) 3. Plasmas as EUV Radiation Emitters—For Understanding EUV Emission from Hot Dense Plasma, Yoneda, pp. 226-233; English Abstract.

* cited by examiner

*Primary Examiner*—Nikita Wells
*Assistant Examiner*—Johnnie L Smith
(74) *Attorney, Agent, or Firm*—David S. Safran; Roberts Mlotkowski Safran & Cole, P.C.

(57) ABSTRACT

In an EUV focusing mirror in which there are several thin concave nested high precision mirrors in the form of an ellipsoid of revolution, a paraboloid of revolution, a Wolter type or the like, the sides which do not constitute the reflection surfaces are made in the shape of a knife edge at the radiation incident ends of the respective mirrors in order not to be shielded by the thickness of the radiation incidence sides of the respective mirrors. Likewise, the radiation exit ends of the respective mirrors are made in the form of a knife edge. This yields an advantageous far-field distribution use of the mirrors for an EUV radiation source device and the degree of reduction of the light intensity can be made smaller than in the conventional case.

11 Claims, 8 Drawing Sheets

EXTREME UV RADIATION FOCUSING MIRROR AND EXTREME UV RADIATION SOURCE DEVICE

BACKGROUND OF THE INVENTION

1. Field of the Invention

The invention relates to an extreme UV radiation focusing mirror for focusing of extreme UV radiation which is emitted by a high density and high temperature plasma, and an extreme UV radiation source device using this extreme UV radiation focusing mirror. The invention relates especially to an extreme UV radiation focusing mirror which focuses extreme UV radiation of the above described plasma with high efficiency and which, moreover, can make the far-field distribution of the light beam at the focus point uniform, and an extreme UV radiation source device using this extreme UV radiation focusing mirror.

2. Description of the Prior Art

According to the miniaturization and increased integration of integrated semiconductor circuits, an increase in resolution is required in a projection exposure device for its manufacture. To meet this requirement, the wavelengths of the exposure radiation source are being increasingly shortened. As a semiconductor exposure radiation source of the next generation in succession to an excimer laser device, an extreme UV radiation source device (hereinafter also called an EUV radiation source device) is being developed which emits extreme UV radiation (extreme ultra violet radiation; hereinafter also called EUV radiation) with wavelengths from 13 nm to 14 nm, especially with a wavelength of 13.5 nm.

SUMMARY OF THE INVENTION

Several schemes are known for producing EUV radiation in an EUV radiation source device. In one, by heating and excitation of a substance for emission of EUV radiation (hereinafter called EUV radiation fuel) a high density and high temperature plasma is produced and EUV radiation is extracted from this plasma.

This EUV radiation source device is, for the most part, divided based on the method of producing a high density and high temperature plasma into an EUV radiation source device of the LPP (Laser Produced Plasma) type and into an EUV radiation source device of the DPP (Discharge Produced Plasma) type (for example, reference is made to the article "Current Status of Research on EUV (extreme ultraviolet) Radiation Sources for Lithography and Future Prospects". J. Plasma. Fusion Res. Vol. 79, No. 3, p.p. 219-260, March 2003).

In an EUV radiation source device of the LPP type, a target of a material which contains an EUV radiation fuel is irradiated with a laser, and a high density and high temperature plasma is produced with a pulsed laser.

On the other hand, in an EUV radiation source device of the DPP type, a high voltage is applied between electrodes to which an EUV radiation fuel is supplied, by which a high density and high temperature plasma is produced by a discharge. The discharge methods used in an EUV radiation source device of the DPP type are a Z pinch method, a capillary discharge method, a dense plasma focus method, a hollow cathode triggered Z-pinch method and the like. The EUV radiation source device of the DPP type, as compared to the EUV radiation source of the LPP type, has the advantages of enabling a small radiation source device and low power consumption of the radiation source system. Practical use in the market is strongly expected.

The arrangement of one example of an EUV radiation source device is described below.

FIG. 6 schematically shows the arrangement of one example of an EUV radiation source device of the DPP type. As is shown in FIG. 6, the EUV radiation source device has a chamber 10 as the discharge vessel. In the chamber 10 a first main discharge electrode (cathode) 11, for example, in the form of a flange, and an annular second main discharge electrode (anode) 12 are mounted such that annular insulator 13 is clamped between them. In this connection, the chamber 10 and the second main discharge electrode 12 are grounded. The first main discharge electrode 11 and the second main discharge electrode 12 are made of a metal with a high melting point, such as, for example, tungsten, molybdenum, tantalum or the like. The insulating material 13 is formed, for example, of silicon nitride, aluminum nitride, diamond, or the like.

The first main discharge electrode 11, in the form of a flange, the annular second main discharge electrode 12 and the annular insulator 13 are arranged such that the respective through openings are essentially coaxial relative to one another, and thus, form a continuous opening. The first main discharge electrode 11 and the second main discharge electrode 12 are electrically connected to a high voltage pulse generation part 18 from which pulsed power is supplied.

If, in the state in which the EUV radiation fuel is supplied, pulsed power is applied between the first main discharge electrode 11 and the second main discharge electrode 12, a high density and high temperature plasma 5 is produced at the above described continuous opening or in the vicinity of the through opening so that EUV radiation with a wavelength of 13.5 nm is emitted therefrom. Thus, the first main discharge electrode 11, the second main discharge electrode 12 and the insulating material 13 are generally designated as "discharge part" 1 in FIG. 6. Furthermore, the above described continuous opening and the vicinity of the continuous opening are called the "part for producing a high density and high temperature plasma."

In the projecting part of the first main discharge electrode 11, there is a tubular insulator 6a for pre-ionization, to which a supply tube 7 for supplying raw material. In turn, the supply tube 7 is connected to a raw material supply unit 14 by which raw material which contains EUV radiation fuel is supplied to the chamber 10. The above described raw material is, for example, SnH$_4$ gas, Xe gas, Li vapor or the like.

The EUV radiation source device focuses EUV radiation which is emitted by the part for producing the high density and high temperature plasma by a focusing means which is located in the chamber 10. This focused radiation is emitted to a subsequent stage from the EUV radiation extracting part 4. A lens which focuses the radiation by refraction cannot be used as a focusing means since EUV radiation with a wavelength of 13.5 nm is absorbed by the glass lens material. Therefore, the focusing means is an extreme UV focusing mirror 2 (hereinafter, also called an EUV focusing mirror) which focuses radiation by reflection. The EUV radiation which has been generated by the part for producing the high density and high temperature plasma is emitted in all directions. As a result, the EUV focusing mirror 2 can be located in any direction with respect to the part for producing a high density and high temperature plasma. The focusing direction is optional. However, if the focused EUV radiation is extracted to a subsequent stage, focusing of the EUV radiation toward the side of the discharge part 1 is impractical, since various components, such as the electrodes and the like, which are present on the side of the discharge part, are in the way. It is therefore desirable to set the EUV focusing direction not toward the side of the discharge part. Normally, as is shown in FIG. 6, there are many cases in which there is a grazing incidence optical system which sets the focusing direction such that the optical axis constitutes the sole single direction.

In order to arrange such a grazing incidence optical system, generally, an EUV focusing mirror is used with an arrangement in which there are several thin concave mirrors that are nested with high precision. The reflection surface of the respective concave mirror, for example, has the shape of an ellipsoid of revolution, a paraboloid of revolution or a shape of the Wolter type. The respective concave mirror has a rotational shape. In this connection, the concept "shape of the Wolter type" means a concave shape, the radiation incidence surface of which is a hyperboloid of revolution and an ellipsoid of revolution or a hyperboloid of revolution and a paraboloid of revolution proceeding from the radiation incidence surface in this sequence.

The substrate material of the above described respective concave mirror is, for example, nickel (Ni), copper (Cu) or the like. Since EUV radiation with a very short wavelength is reflected, the reflection surface of the concave mirror is formed as a very flat surface. The reflection material attached to this smooth surface is a metal film, for example, of ruthenium (Ru), molybdenum (Mo), rhodium (Rh) or the like. The reflection surface of the respective concave mirror is finely coated with this metal film.

The EUV focusing mirror 2 has a reflection surface with the shape of an ellipsoid of revolution, a paraboloid of revolution, a shape of the Wolter type or the like. It has several concave mirrors in a rotational shape with diameters which differ from one another. In these concave mirrors of the EUV focusing mirror, the axes of the rotation means are located coaxially with one another such that the focus positions essentially agree with one another. The EUV focusing mirror can advantageously reflect the EUV radiation with a grazing incidence angle from 0° to 25° and also can focus on a single point by this arrangement of the concave mirror with high precision in the form of nesting.

The reflection factor of the reflection surface of the concave mirror which is coated with the above described metal film of Ru, Mo, Rh and the like is greater, the smaller the grazing incidence angle. For a concave mirror with a reflection surface which has the shape of an ellipsoid of revolution or a paraboloid of revolution, generally, reflection only takes place once, while for a concave mirror with a reflection surface which has a shape of the Wolter type (hereinafter also called a Wolter mirror) reflection takes place twice.

In these concave mirrors in the case of focusing of radiation which is being emitted from the same radiation point onto the same focus point, the grazing incidence angle on the respective reflection surface of the Wolter mirror is roughly ½ of the grazing incidence angle on the reflection surface of the concave mirror with the shape of an ellipsoid of revolution and on the reflection surface of the concave mirror with the shape of a paraboloid of revolution.

If the grazing incidence angle in the concave mirror becomes larger than a certain angle reflection takes place twice before turning takes place once with the concave mirror with the shape of an ellipsoid of revolution or a paraboloid of revolution. The reflection factor of the EUV radiation for a Wolter mirror with a grazing incidence angle of roughly ½ is, however, larger. Therefore, for the EUV radiation source device, there are many cases in which the EUV focusing mirror is formed of several Wolter mirrors.

Between the above described discharge part 1 and the EUV focusing mirror 2, there is a foil trap 3 which is used to trap debris, such as metallic powder, particles which are produced by sputtering of the metal (for example, discharge electrodes) which makes contact with the high density and high temperature plasma by the above described plasma, and contaminants and the like as a result of the radiation fuel, and furthermore, to reduce the kinetic energy and for simultaneous passage of the EUV radiation. As described, for example, in Japanese patent application publication JP-A-2002-504746 and corresponding U.S. Pat. No. 6,359,969, the foil trap 3 is formed of several plates which are arranged in the radial direction of the area in which the high density and high temperature plasma is produced, and is supported by the foil trap support wall 3a.

In the space of the chamber 10 in which the discharge part 1 is located, there are a pressure monitor 17 for monitoring the pressure of the discharge part 1 and a gas outlet opening 8 which is connected to the gas evacuation unit 15. The gas evacuation unit 15 controls the pressure of the part for producing a high density and high temperature plasma based on the measured value of this pressure monitor 17 and evacuates the chamber.

Furthermore, a buffer gas unit 16 can be connected to the side of the space of the chamber in which the EUV focusing mirror 2 is located and gas can also be supplied to it, which has nothing to do with the emission of EUV radiation. The buffer gas proceeds from the side of the EUV focusing mirror 2 through the foil trap 3 and flows to the side of the discharge part 1, passes through an evacuation passage and is released from the gas evacuation unit 15. By the formation of this flow of buffer gas, it is possible to prevent contamination which has not been completely trapped by the foil trap 3 from flowing from the side of the discharge part 1 toward the side of the EUV focusing mirror 2, and thus, damage to the EUV focusing mirror 2 by the contamination can be reduced.

Furthermore, the EUV radiation source device of the DPP type has a control unit 20 which, based on the EUV emission command or the like from an exposure device (control unit 21), controls the high voltage pulse generation part 18, the raw material supply unit 14, the gas evacuation unit 15 and the buffer gas unit 16.

Operation of the above described EUV radiation source device is described below using an example.

In the radiation source device of the DPP type shown in FIG. 6, raw material which contains an EUV radiation fuel is supplied from the raw material supply unit 14 to the chamber 10. If pulsed power is supplied between the first and second main discharge electrodes 11, 12 from the high voltage pulse generation part 18, a creeping discharge is formed on the surface of the insulator 13 by which, essentially, a short circuit state forms between the first and second main discharge electrodes 11, 12 and a pulse-like, large current flows.

In this connection, a plasma is formed on the continuous, essentially coaxial openings of the first main discharge electrode 11, the second main discharge electrode 12 and the insulator 13 or in the vicinity thereof. Afterwards, the plasma is heated and excited by Joulean heating by the pinch effect. As a result, essentially in the middle region of the above described plasma, a high density and high temperature plasma 5 is formed from which EUV radiation with a wavelength of 13.5 nm is emitted, which is focused by means of the above described EUV focusing mirror 2 and is extracted by the EUV radiation extracting part 4 which is located in the chamber 10. This EUV radiation extracting part 4 is coupled to an EUV radiation incidence part which is located in the cage-like body of an exposure machine (not shown). This means that the EUV radiation which has been focused by means of the EUV focusing mirror 2 is incident in the exposure device via the EUV radiation extracting part and the EUV radiation incidence part.

In this connection, the radiation source device of the DPP type can also be provided with a pre-ionization means for pre-ionization of the raw material which contains the EUV radiation fuel which has been supplied to the chamber 10 when the discharge is produced in the chamber. In the production of EUV radiation, the pressure of the discharge part is adjusted, for example, to 1 Pa to 20 Pa. At such a low pressure, depending on the electrode arrangement, formation of the discharge becomes more difficult. As a result, there are also cases in which the output of EUV radiation becomes unstable. To produce a stable discharge in a situation in which formation of the discharge is difficult, it is desirable to carry out pre-ionization.

In FIG. 6, the pre-ionization unit 6 is comprised of a convex part of the electrically conductive first main discharge electrode 11, a tubular insulator for pre-ionization 6a which has been inserted into the convex part of the first main discharge electrode 11, and a conductive tube 7 for feed of the raw material which has been inserted into this insulator for pre-ionization 6a.

The convex part of the conductive first main discharge electrode 11 and the tube for feeding the raw material 7 are connected to the current source part for pre-ionization 19. When a voltage pulse is applied between the convex part of the first main discharge electrode 11 and the tube for feeding the raw material 7 by the current source for pre-ionization 19, as is shown in FIG. 6, a creeping discharge is formed on the inner surface of the insulator for pre-ionization 6a, by which ionization of the raw material which contains the EUV radiation fuel which is fed into the chamber 10 is accelerated. The above described current source for pre-ionization 19 is controlled by the control unit 20.

As was described above, the projecting part of the coaxially arranged first main discharge electrode 11, the insulator for pre-ionization 6a and the tube for feeding raw material 7 also act as the raw material supply guide paths by which the raw material which contains the EUV radiation fuel is supplied. One example of the combination of an EUV radiation source device of the DPP type with a pre-ionization unit 6 is disclosed, for example, in Japanese patent application publication JP-A-2003-218025 and corresponding U.S. Pat. No. 6,894,298.

In this connection an exposure machine in which EUV radiation is incident is simply described, although it is not shown in the drawings.

Since the EUV radiation is absorbed by air, all components, such as the illumination optical system, the mask, the projection optical system, the workpiece, the workpiece holder and the like of the exposure machine are located in a vacuum. These components are located, for example, in a cage-like body of the exposure machine. The inside of the cage-like body of the exposure machine is evacuated by a gas evacuation unit which is connected to the gas outlet opening which is attached in the cage-like body of the exposure machine. In this way, a vacuum state is achieved. The EUV radiation extracting part 4 which is located in the EUV radiation source device is coupled to an EUV radiation incidence part which is located in the cage-like body of the exposure machine. The inside of the chamber of the EUV radiation source device and the inside of the cage-like body of the exposure machine have arrangements in which differential pumping is possible by the gas evacuation unit arranged at the time. On the other hand, since the EUV radiation is absorbed by the glass material, for an exposure machine, an optical system using a lens of glass or the like cannot be used. This means that, due to the high absorption by the optical parts of glass, it is difficult to irradiate a workpiece, such as a wafer, to which, for example, a photoresist has been applied with EUV radiation.

Therefore, a reflection optical system is used as the optical system in the exposure machine. The illumination optical system directs the EUV radiation which is incident from the EUV radiation incidence part and illuminates the mask of the reflection type on which the circuit pattern is recorded. This illumination optical system consists of optical elements of the reflection type such as a reflection mirror and the like.

In an optical system using a mask of the reflection type, the EUV radiation reflected by the mask of the reflection type is subjected to reducing projection by the projection optical system onto the workpiece. As was described above, when the workpiece is a wafer to which a photoresist has been applied, in the above described resist a circuit pattern of the mask is formed which is subject to reducing projection. For the above described projection optical system, as for the illumination optical system, an optical system of the reflection type is used which consists of optical elements of the reflection type such as at least one reflection mirror and the like.

As was described above, the EUV focusing mirror has several concave mirrors in a rotational shape with diameters which differ from one another. These concave mirrors comprising the EUV focusing mirror are coaxially arranged such that the axes of their rotation means come to rest on top of one another such that the focus positions essentially agree with one another. The EUV focusing mirror can advantageously reflect the EUV radiation with a grazing incidence angle from 0° to 25° and moreover focus it by this arrangement of the concave mirrors with high precision in the form of interlacing.

In the case of an EUV focusing mirror of the grazing incidence type with this arrangement however the incident radiation is shielded according to the thickness of the substrate material of the respective concave mirror. There is the disadvantage that nonuniformity of the illuminance results from this shielded region on the workpiece. The invention is further described below using drawings.

FIGS. 7(*a*) & 7(*b*) each schematically show in the effect of the thickness of the substrate material of the EUV focusing mirror. The EUV focusing mirror shown in FIGS. 7(*a*) & 7(*b*) is formed, for example, by there being five nested Wolter mirrors a, b, c, d, e with different diameters.

The reflection surfaces of the respective Wolter mirrors a, b, c, d, and e proceeding from the radiation incidence side have the shape of a hyperbola and the shape of an ellipsoid.

In FIGS. 7(*a*) & 7(*b*), the solid lines a1, b1, c1, d1 and e1 represent the geometric location of the light beams which pass from the plasma position through the incidence ends and exit ends of the respective Wolter mirrors a, b, c, d, and e. Solid lines a1, b1, c1, d1 and e1 are specifically the geometric locations of the light beams in the case of the maximum incidence angle on the respective Wolter mirrors a, b, c, d, and e of the radiation which has been focused by the respective Wolter mirrors a, b, c, d, and e onto given sites.

On the other hand, in FIGS. 7(*a*) & 7(*b*), the double dot-dash line e3 constitutes the geometric location of a light beam in the case of reflection on the boundary between the hyperbola and the elliptical surface for the Wolter mirror e. It is specifically the geometric location of a light beam in the case of a minimum incidence angle into the Wolter mirror e of the radiation which has been focused by the Wolter mirror e onto given sites.

In FIG. 7(a) the double dot-dash lines a3, b3, c3, and d3 represent the geometric locations of the light beams which are reflected on the boundary between the hyperbola and the elliptical surface for the respective Wolter mirrors a, b, c, and d, assuming the presence of Wolter mirrors a, b, c, and d which are independent of one another. This means that the double dot-dash lines a3, b3, c3, and d3 are the geometric locations of the light beams in the case of the minimum incidence angle on the respective Wolter mirrors a, b, c, and d of the radiation which has been focused by the respective Wolter mirrors a, b, c, and d onto given sites.

The geometric locations of the light beams which have been focused by the respective Wolter mirrors a, b, c, d, and e therefore appear as follows.

The light beams proceeding from the plasma emission point until incidence on the hyperbolas of the respective Wolter mirrors a, b, c, d, and e pass through the region which is formed by the following:

the distance between the plasma and the incidence end of the respective Wolter mirrors a, b, c, d, and e for the solid lines a1, b1, c1, d1, and e1;

the distance between the plasma and the boundary between the hyperbolas and the elliptical surfaces of the respective Wolter mirrors a, b, c, d, and e for the double dot-dash line a3, b3, c3, d3 and e3; and a hyperbola.

Light beams which pass outside this region are not focused. In the case of the independent presence, for example, of a Wolter mirror, a the light beam which is incident from the plasma emission point on the hyperbola of the Wolter mirror a passes through the region A.

On the other hand, the light beams which are reflected by the elliptical surfaces of the respective Wolter mirrors a, b, c, d, and e pass through a region which is formed by the following:

a distance after reflection from the elliptical surfaces for the solid lines a1, b1, c1, d1, and e1;

a distance after reflection from the boundaries between the hyperbolas and the elliptical surfaces for the double dot-dash lines a3, b3, c3, d3 and e3; and an elliptical surface.

Light beams which pass outside the region are not focused. In the case of the independent presence, for example, of a Wolter mirror a, the light beam which is incident from the elliptical surface of the Wolter mirror a passes through the region B.

However, the above described regions, in reality, are limited only according to the thickness of the substrate material of the Wolter mirrors b, c, d and e which are located inside.

The dot-dash lines a2, b2, c3, and d2 as shown in FIG. 7(b) are the geometric locations of the light beam in the case of a maximum incidence angle on the respective Wolter mirrors a, b, c, and d of the radiation which is not shielded from the ends (radiation incidence ends) on the radiation incidence sides of the inside mirrors and/or from the ends (radiation exit ends) of the end on the radiation exit sides. The dot-dash line a2 is, for example, the geometric location of a light beam which is incident in the Wolter mirror a and is reflected by it. It is the geometric location of the light beam in the case of the maximum incidence angle on the Wolter mirror a of the radiation which is not shielded from the light incidence end of the Wolter mirror b which is located on the inside of the Wolter mirror a and/or from the radiation exit surface thereof.

As becomes apparent from FIGS. 7(a) & 7(b), the incidence angles on the dot-dash lines a2, b2, c2 and d2 as shown in FIG. 7(b) are greater than the incidence angles of the double dash lines a3, b3, c3, and d3 as shown in FIG. 7(a).

Therefore, on the radiation incidence side of the EUV focusing mirror, the light beams which pass through the region between the dot-dash lines a2, b2, c2 and d2 and the double dash lines a3, b3, c3 and d3 are shielded by the effect of the thickness of the respective Wolter mirror b, c, d and e and are not incident on the hyperbolas of the respective Wolter mirrors a, b, c and d.

In FIG. 7(b), therefore, the space between the dot-dash line a2 and the solid line b1, the space between the dot-dash line b2 and the solid line c1, the space between the dot-dash line c2 and the solid line d1, and the space between the dot-dash line d2 and the solid line e1 which are located in front of the light exit ends of the respective Wolter mirrors a, b, c and d constitute a shield region which is influenced by the thickness of the substrate material of the Wolter mirrors b, c, d and e which are located on the inside.

FIG. 8 is a schematic of the far-field distribution of the radiation emerging from the EUV focusing mirror. In FIG. 8, the EUV radiation on the focusing surface does not constitute a point, but a region with a certain area where the focusing surface is the virtual area which is perpendicular to the optical axis and which is located at the position on which the EUV radiation is focused by the EUV focusing mirror is called the focusing area. In this connection, the EUV radiation which can be used in the exposure machine is dependent on the light conductance (etendue) which is limited by the optical system of the exposure machine. This means that the size of the above described EUV radiation region which can be used for exposure, from the EUV radiation region on the focusing surface is dependent on this etendue and the solid angle of the EUV radiation which emerges from the focusing surface.

At this point, the light distribution is considered at the position which is as far as the EUV radiation focused on the focusing surface can be regarded as a point radiation source (hereinafter, this light distribution is also called the far-field distribution). As is shown in FIG. 8, the far-field distribution is influenced by the shielded region (screened area) shown in FIG. 7(b), by which a region is present in which the light intensity decreases to an extreme degree.

As was described above, for the optical system within the exposure machine in which the EUV radiation is incident a reflection optical system including the mask is used. This means that the illumination optical system and the projection optical system each consist of several reflection mirrors. In the case of exposure of a workpiece using such on optical system, the nonuniformity of the far-field distribution which is shown in FIG. 8 leads directly to nonuniformity of the illuminance on the illumination surface of the workpiece. When the workpiece is a wafer to which a resist has been applied, in the region with an extremely small radiation intensity on the wafer, the disadvantage arises that the resist is not photosensitive.

A focusing mirror of the Wolter type was described above. However, the same disadvantage also occurs for the shape of an ellipsoid of revolution or a paraboloid of revolution.

The following two processes can be considered as processes for suppressing the nonuniformity of the illuminance on the workpiece as a result of the thickness of the substrate material of the respective above described concave mirror.

(1) Use of a Fly-Eye Mirror

A fly-eye mirror is inserted into the illumination optical system of the exposure machine which, as described, for example, in Japanese patent application publication JP-A-2006-19510, has an arrangement in which several reflection elements are arranged parallel to one another and are formed of spherical mirrors. By the arrangement of the illumination optical system such that the reflection rays from the many reflection elements in spherical shape which are formed in the fly-eye mirror are superimposed, an increase in the uniformity of the distribution of the illuminance on the exposure surface of the workpiece is enabled.

The optical efficiency of an optical element of the reflection type is generally greatly influenced by the evenness of the reflection surface. In the case of low precision evenness, the scattering loss on the reflection surface increases and the degree of utilization of the radiation decreases. In order to adequately reduce the effect of the scattering loss on the reflection surface it is desirable to fix the evenness of the reflection surface at less than or equal to 10/λ, where λ designates the wavelength of the radiation used.

Therefore, in the case of an exposure machine using EUV radiation, there is a demand for an evenness of 1 nm or less with respect to the reflection surface of the optical element of the reflection type. However, a fly-eye mirror with evenness of such high precision is difficult to manufacture and is very expensive. As a result, it is impractical to suppress the scattering loss of the illuminance on the workpiece using a fly-eye mirror.

(2) Reducing the Thickness of the Substrate Material of the Respective Concave Mirror The above described disadvantage is controlled by reducing the thickness of the substrate material of the respective concave mirror to an extreme degree. However, in reality, it is difficult to reduce the thickness of the substrate material of the respective concave mirror for the following reasons. For example, if a throughput of 100 w/h (exposure of 100 wafers with 300 mm per hour) is assumed for an exposure machine for mass production, at the focal point of the EUV radiation which is focused by means of the EUV focusing mirror, an output wattage of 115 W is required. Furthermore, depending on the sensitivity of the photoresist used, an output power of at least 115 W is required. On the other hand, the conversion efficiency which is represented by the ratio of the radiation energy of the EUV radiation to the energy which is supplied to the plasma is at most a few percent.

For the part for producing a high density and high temperature plasma which contains the EUV emission point, at least 10 kW of the wattage input into the plasma is changed in heat. This means that the part for producing a high density and high temperature plasma reaches an enormously high temperature.

On the other hand, to implement the reduction in size of the EUV focusing mirror and to increase the focusing ability of the EUV focusing mirror, the EUV focusing mirror must be brought as close as possible to the part for producing a high density and high temperature plasma which contains the EUV emission point.

Therefore, the EUV focusing mirror receives thermal radiation from the part for producing a high density and high temperature plasma. This means that the heat absorption per unit of area of the respective concave mirror is increased so that a temperature increase of the respective concave mirror is inevitable. The respective concave mirror is deformed due to thermal expansion so that there is the disadvantage that a given focusing efficiency can no longer be obtained. Furthermore, there is also a case in which the disadvantages of cracks and detachment of the reflection film with which the reflection surface is provided occur.

Therefore, cooling of the EUV focusing mirror is required. As was described above, the pressure of the discharge part which produces the EUV radiation is adjusted, for example, to 1 Pa to 20 Pa. The pressure within the chamber in which the EUV focusing mirror is located is also fixed at a low pressure. Under an atmosphere with a low pressure, cooling by convection becomes difficult. Therefore, cooling using heat conduction must necessarily be utilized. It can be imagined, for example, that the EUV focusing mirror might be wound with a cooling tube in which a coolant circulates and the heat which has been transmitted by heat conduction be eliminated by heat exchange.

However, the amount of heat conduction is proportional to the heat transfer cross-sectional area. An extreme reduction of the thickness of the substrate material of the respective concave mirror means a reduction of this heat transfer cross-sectional area. This means that the heat cannot be effectively eliminated by heat exchange due to the reduction of the amount of heat that can be transferred. In the case of using an EUV focusing mirror for the EUV radiation source device, to effectively carry out cooling, the substrate material of the respective concave mirror would need to have a thickness of roughly 1 mm. This means that, in practice, it is difficult to suppress the nonuniformity of the illuminance on the workpiece by reducing the thickness of the substrate material of the respective concave mirror.

SUMMARY OF THE INVENTION

A primary goal of the invention is to eliminate the above described disadvantages in the prior art. Therefore, a primary object of the invention is to devise an EUV focusing mirror in which the far-field distribution of the EUV radiation which has been focused by the EUV focusing mirror can be made advantageous and the nonuniformity (scattering) of the illuminance can be suppressed, and to devise an EUV radiation source device using such an EUV focusing mirror.

The EUV focusing mirror in accordance with the invention, like a conventional EUV focusing mirror, has several concave mirrors in a rotation shape with different diameters. The concave mirrors comprising the EUV focusing mirror are coaxially arranged such that their axes of revolution agree with one another such that the focus positions essentially agree with one another. The EUV focusing mirror is made such that the EUV radiation with a grazing incidence angle from 0° to 25° can be advantageously reflected, and moreover, focused by this arrangement of the interlaced high precision concave mirrors.

The above described object is also achieved in accordance with the invention as follows:

(1) For an extreme UV radiation focusing mirror of the grazing incidence type in which there are several nested concave mirrors with different diameters, on the end of the respective concave mirror on the side which is not the reflection surface, a bevel is formed such that it has a given angle with respect to the radiation reflection surface.

This means that a bevel is formed on the end on the radiation incidence side of the respective concave mirror of the EUV focusing mirror and/or on the end on the radiation exit side thereof. Specifically, on the end on the radiation incidence side and on the end on the radiation exit side of the respective concave mirror, a bevel is formed such that the end on the radiation incidence side and/or the end on the radiation exit side of the above described concave mirror drops out of the away region of the incidence EUV radiation which is focused by the EUV focusing mirror, and of the away region of the exit radiation thereof.

The area which contains this bevel is called the edge area. Furthermore, the state in which on the end a bevel is formed such that its thickness becomes smaller, the more it approaches the tip, is called a knife edge type. Also, the end on which this bevel is formed is called the knife edge part.

(2) In (1), the shape of the reflection surface of the above described concave mirror is one of the shapes of an ellipsoid of revolution, a paraboloid of revolution, or a Wolter shape. In this connection, the focal points of the respective concave mirrors essentially coincide with one another.

(3) In (1) and (2), the angle of the bevel on the radiation incidence side of the end of the above described concave mirror is set such that it is a positive angle in the clockwise direction with respect to the running direction of the extreme UV radiation which is incident on the above described radiation incidence end.

(4) In (1) and (2), the angle of the bevel on the radiation exit side of the end of the above described concave mirror is set such that it is a negative angle in the clockwise direction with respect to the running direction of the extreme UV radiation which emerges from the above described radiation exit end.

(5) In (1) and (2), the angle of the bevel on the radiation incidence side of the end of the above described concave mirror is set such that it is a positive angle in the clockwise direction with respect to the running direction of the extreme UV radiation and furthermore the angle of the bevel on the radiation exit side of the end of the above described concave mirror is set such that it is a negative angle in the clockwise direction with respect to the running direction of the emerging UV radiation.

(6) In an extreme UV radiation device which comprises the following:
- a vessel;
- a raw material supply means for supply of raw material which contains an extreme UV radiation fuel and/or a compound of an extreme UV radiation fuel to this vessel;
- a means for heating and excitation which heats and excites the supplied raw material in the above described vessel and in which a plasma is produced that emits radiation which contains extreme UV radiation;
- a focusing optical means which is located in the above described vessel to focus the radiation which has been emitted from the above described plasma; and
- a radiation extracting part from which the focused radiation is extracted from the vessel, the above described focusing optical system is the extreme UV radiation focusing mirror which was described in (1) to (5).

Action of the Invention

As was described above, the following effects can be obtained in accordance with the invention.

(1) By the measure that, on the side of the end on the radiation incidence side and/or of the end on the radiation exit side which does not constitute the reflection surface of the respective concave mirror of the EUV focusing mirror, a bevel in the form of a knife edge is formed, the disadvantage of formation of nonuniformity/scattering of the illuminance on the workpiece by the shielded region can be prevented by the amount of thickness of the substrate material of the respective concave mirror.

(2) By the measure that the angle of the bevel on the radiation incidence side of the end of the concave mirror is set such that it is a positive angle in the clockwise direction with respect to the running direction of the extreme UV radiation which is incident on the radiation incidence end and that the angle of the bevel on the radiation exit side of the end of the concave mirror is set such that it is a negative angle in the clockwise direction with respect to the running direction of the extreme UV radiation emerging from the radiation exit end, the shielding ratio of the grazing incident EUV radiation onto the end of the respective concave mirror can be reduced to a dramatic degree and the region with reduced light intensity for far-field distribution can be reduced. It becomes possible to reduce the nonuniformity of the illuminance on the workpiece.

The invention is further described below with reference to the accompanying drawings.

DETAILED DESCRIPTION OF THE INVENTION

Figure 1:
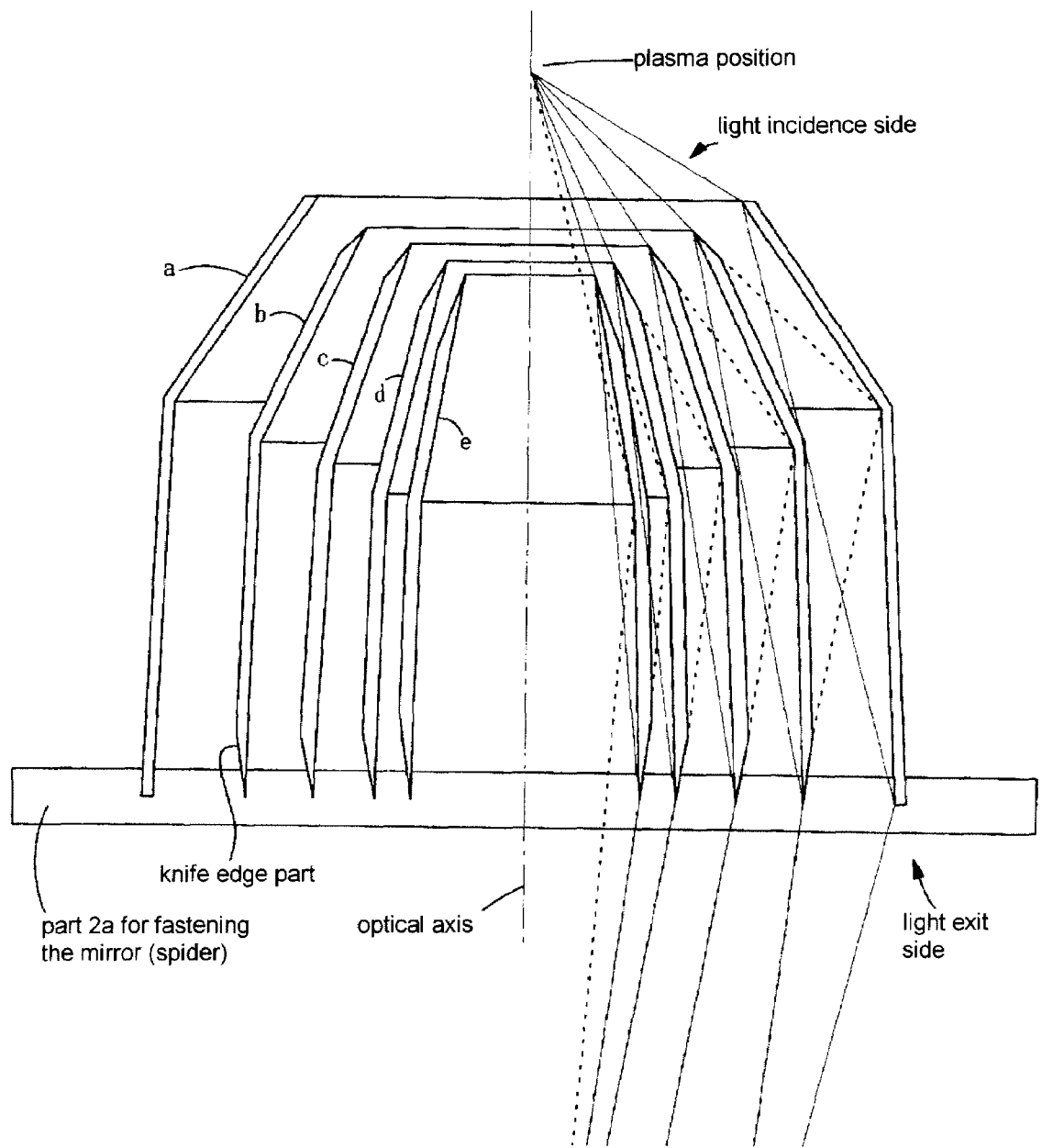
FIG. 1 is a schematic cross-sectional view of the arrangement of a focusing mirror in accordance with the invention.
Figure 2:
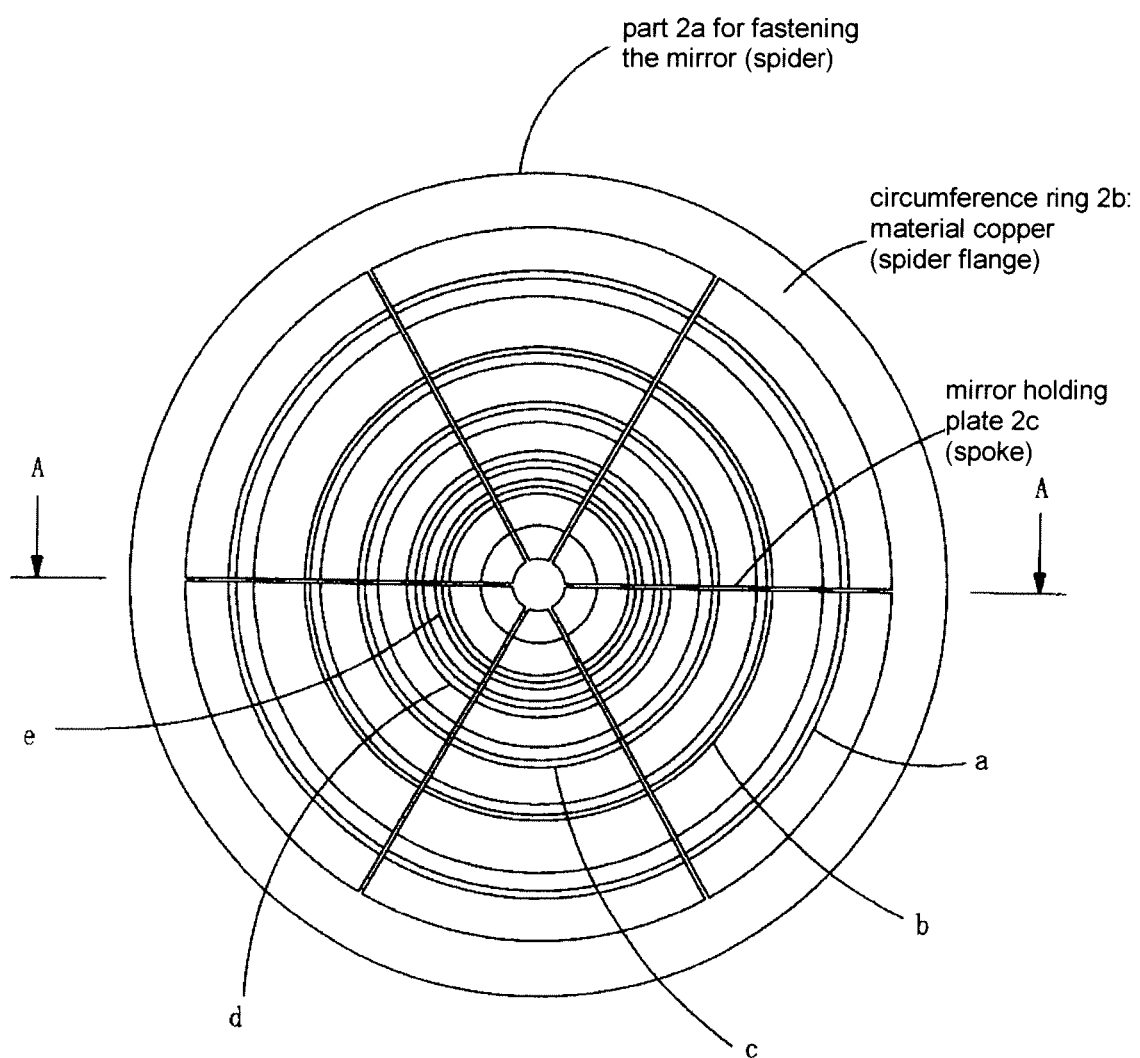
FIG. 2 is a schematic view of the arrangement of a focusing mirror in accordance with the invention in which it is being viewed from the radiation exit side.

FIGS. 1 & 2 schematically show the arrangement of a focusing mirror in accordance with the invention, FIG. 1 being a cross section of the focusing mirror through a plane which passes through the optical axis (A-A cross section as shown in FIG. 2). FIG. 2 shows the focusing mirror as viewed from the radiation exit side. In the figures, a case is shown in which the above described shape of the reflection surface is of the Wolter type. However, the reflection shape can also be an ellipsoid of revolution, a paraboloid of revolution or the like.

FIGS. 1 & 2 show an arrangement in which there are, for example, five nested Wolter mirrors a, b, c, d, and e of different diameters. The reflection surface of the respective Wolter mirrors a, b, c, d, and e, proceeding from the radiation incidence side, have the shape of a hyperboloid and the shape of an ellipsoid. Furthermore, knife edge parts are formed by bevels on the ends of each of the Wolter mirrors b through e on the sides which do not constitute the reflection surfaces.

As is shown in FIG. 2, on the radiation exit sides of the respective Wolter mirror a to e, there is a spider 2a which is comprised, for example, of a spider flange 2b of copper and spokes 2c. The ends of the respective Wolter mirrors a to e, on the radiation exit side, as shown in FIG. 1, are installed in a groove of the spoke 2c, and for example, are attached by means of a cement or a fixing brace or the like.

Figure 3A:
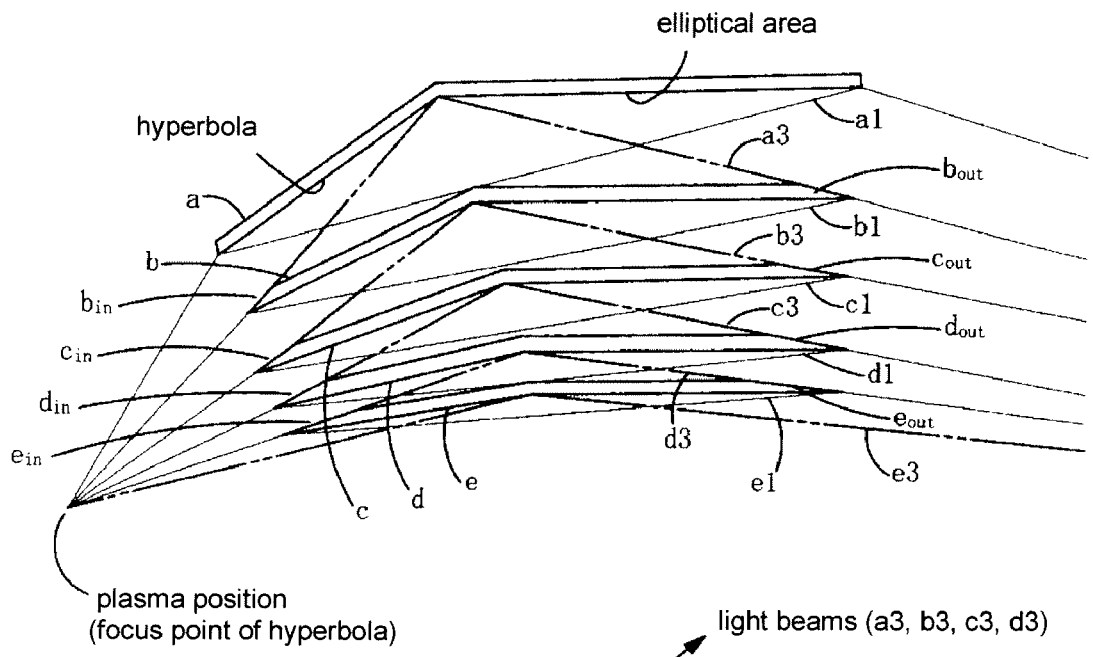
FIG. 3(a) is a schematic cross-sectional view one embodiment of the focusing mirror in accordance with the invention showing geometric locations of the light beams relative thereto.

FIG. 3(a) is a schematic of the geometric locations of the light beams of one embodiment of the focusing mirror in accordance with the invention. In the figure, as also in FIG. 7(a), the solid lines a1, b1, c1, d1 and e1 show the geometric locations of the light beams which pass proceeding from the plasma position through the radiation incidence ends and radiation exit ends of the respective Wolter mirrors a, b, c, d, and e. This means that the solid lines a1, b1, c1, d1 and e1 represent the geometric locations of the light beams in the case of the maximum incidence angle on the respective Wolter mirrors a, b, c, d, and e of the radiation which has been focused by the respective Wolter mirrors a, b, c, d, and e onto given sites.

Figure 7A:
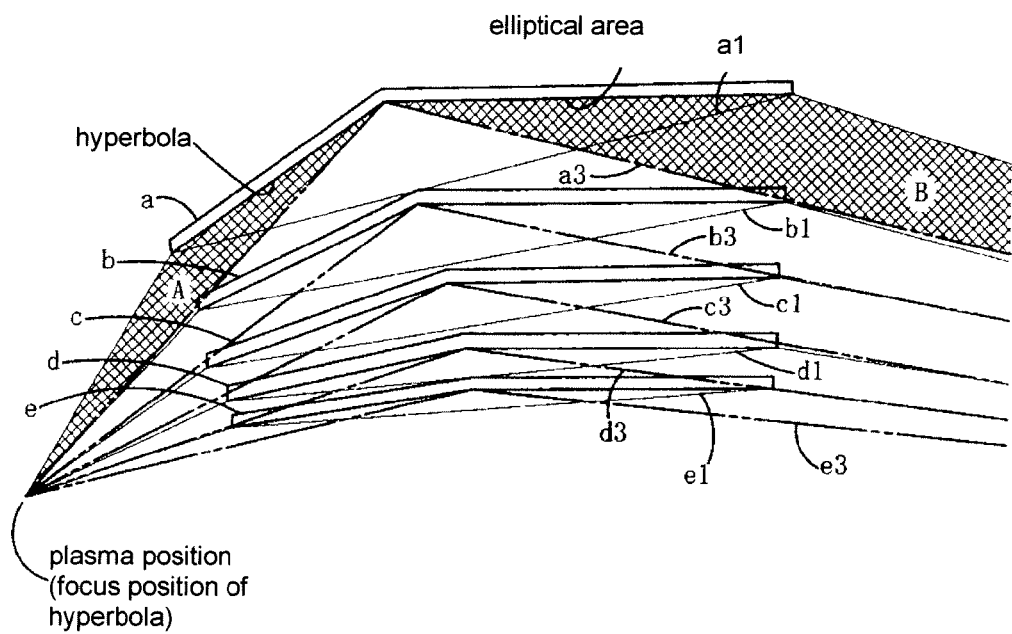
FIGS. 7(a) & 7(b) each show a schematic of the effect of the thickness of the substrate material for a focusing mirror.

On the other hand, the double dot-dash lines a3, b3, c3, d3 and e3, as also in FIG. 7(a), are the geometric locations of the light beams in the case of reflection on the boundaries between the hyperbolas and the ellipsoids for the respective Wolter mirrors a, b, c, d, and e. This means that the double dot-dash lines a3, b3, c3, d3 and e3 are the geometric locations of the light beams in the case of the minimum incidence angle of the radiation which is being focused by the respective Wolter mirrors a, b, c, d and e onto given sites, into the respective Wolter mirrors a, b, c, d and e.

It also means that the rays which have been focused by the respective Wolter mirrors a, b, c, d and e pass through a space between the solid lines a1, b1, c1, d1, e1 and the double dot-dash lines a3, b3, c3, d3 and e3. The radiation which has been focused by the Wolter mirror e passes through a space between the light beams e1 and the light beams e3 while the light beams which pass outside this space are not focused.

The geometric locations of the light beams which are focused by the respective Wolter mirrors a, b, c, d, e therefore appear as follows.

The light beams proceeding from the plasma emission point until incidence on the hyperbolas of the respective Wolter mirrors a, b, c, d, e pass through the region which is formed by the following:

the distance between the plasma and the incidence ends of the respective Wolter mirrors a, b, c, d, and e for the solid lines a1, b1, c1, d1, and e1;

the distance between the plasma and the boundaries between the hyperbolas and the elliptical surfaces of the respective Wolter mirrors a, b, c, d, and e for the double dot-dash line a3, b3, c3, d3 and e3, and a hyperbola.

Light beams which pass outside this region are not focused.

On the other hand, the light beams which are reflected by the elliptical surfaces of the respective Wolter mirrors a, b, c, d, and e pass through a region which is formed by the following:

a distance after reflection from the elliptical surfaces for the solid lines a1, b1, c1, d1, and e1;

a distance after reflection from the boundaries between the hyperbolas and the elliptical surfaces for the double dot-dash lines a3, b3, c3, d3 and e3; and solid lines a1, b1, c1, d1, and e1;

double dot-dash lines a3, b3, c3, d3 and e3;

an elliptical surface.

Light beams which pass outside the region are not focused.

Figure 7B:
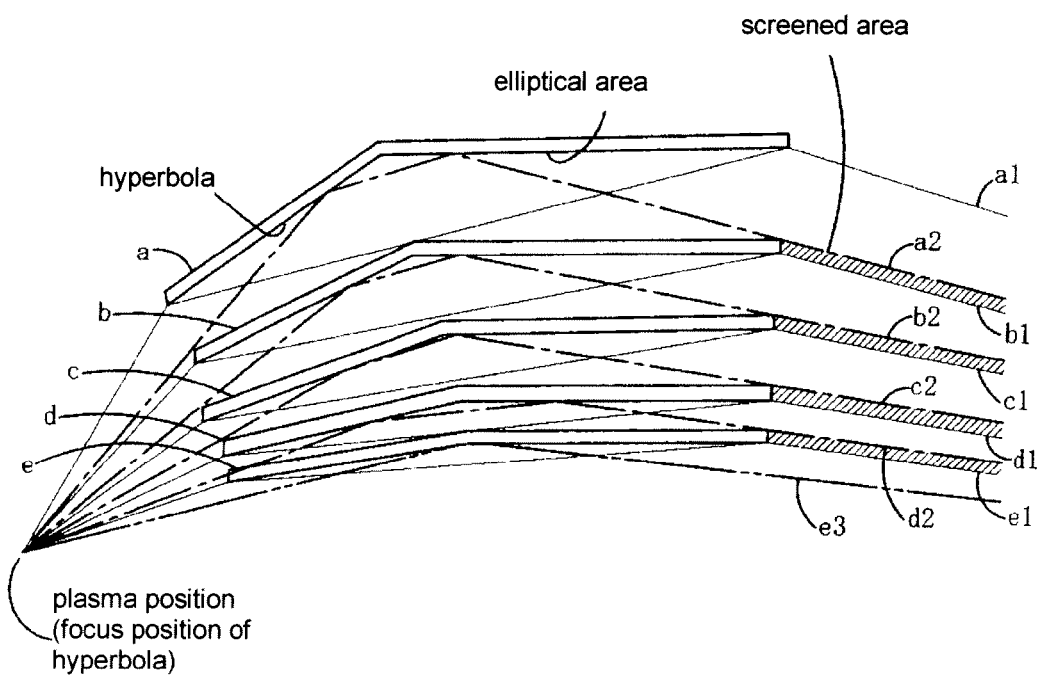
Figure 8:
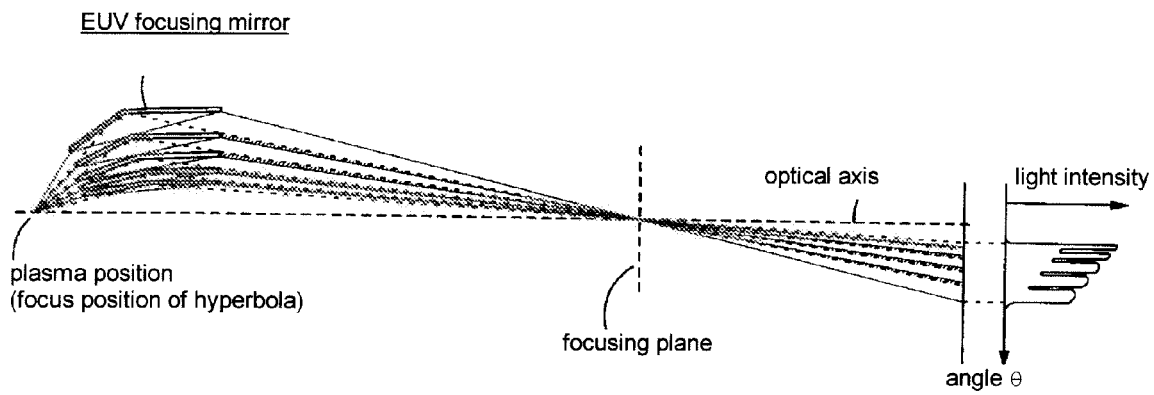
FIG. 8 shows a schematic of the far-field distribution of the radiation emerging from a conventional EUV focusing mirror.

Conventionally, the above described double dot-dash lines a3, b3, c3, and d3 were shielded by the thick parts of the incidence ends of the respective Wolter mirrors b, c, d, e. The geometric locations of the light beams in the case of a minimum incidence angle on the respective Wolter mirrors a, b, c, d, e were therefore the dot-dash lines a2, b2, c2 and d2, as is shown in FIG. 7(b).

For the EUV focusing mirror in accordance with the invention, the sides of the radiation incidence ends of the respective Wolter mirrors b to e which do not constitute reflection surfaces, are made in the form of knife edges so that the above described double dot dash lines a3, b3, c3, and d3 are not shielded by the thick parts of the ends on the radiation incidence sides (radiation incidence ends) of the respective Wolter mirrors b, c, d, e.

Figure 3B:
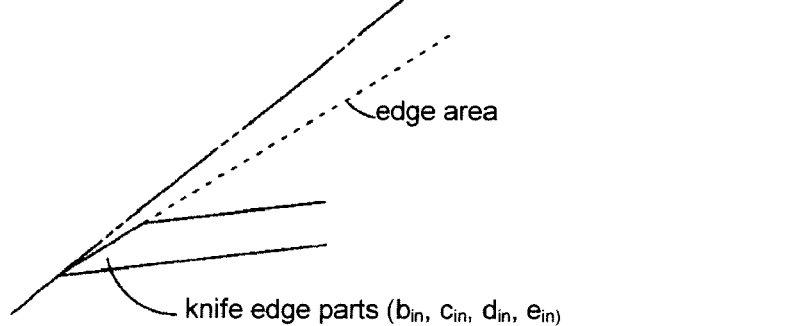
FIGS. 3(b) & 3(c) each show a schematic of the angle and the light beam direction of the edge side.

This means that, on the radiation incidence ends of the respective Wolter mirrors b, c, d, e, there are knife edge parts $b_{in}$, $c_{in}$, $d_{in}$, $e_{in}$, as is shown in FIG. 3(b). The angle of the edge side of the knife edge part (plane including the bevel) is set such that it becomes an identical or positive angle with respect to the directions in which the light beams a3, b3, c3, d3 (shown using the double dot-dash lines run), when the clockwise direction is considered positive.

Likewise, the radiation exit ends of the respective Wolter mirrors b, c, d, e are made in the form of a knife edge so that the above described double dot-dash lines a3, b3, c3, and d3 are not shielded.

Figure 3C:
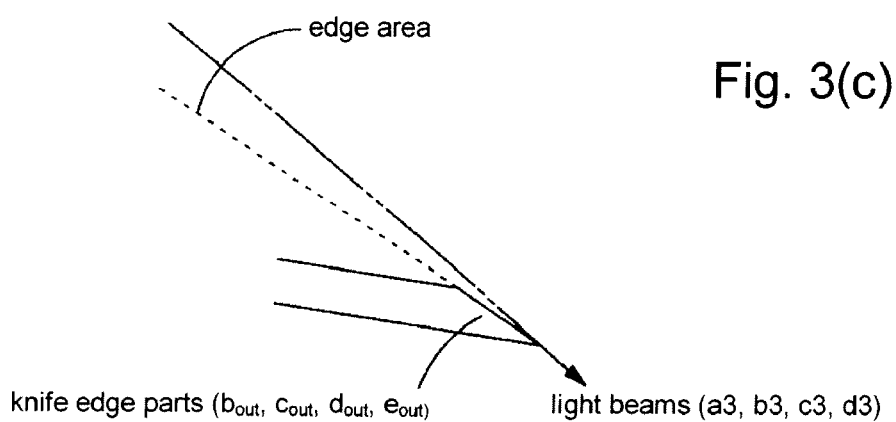

This means that, on the radiation exit and incidence ends of the respective Wolter mirrors b, c, d, e, there are knife edge parts $b_{out}$, $c_{out}$, $d_{out}$, $e_{out}$, as is shown in FIG. 3(c). The angle of the edge side of the knife edge part (plane including the bevel) is set such that it becomes an identical or negative angle with respect to the directions in which the light beams a3, b3, c3, d3 (shown using the double dot-dash lines) run when the clockwise direction is considered positive.

Figure 4:
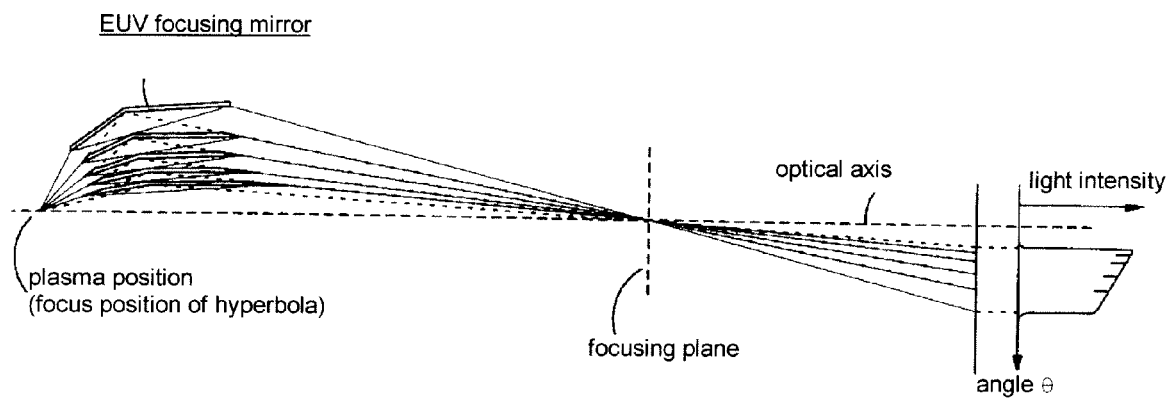
FIG. 4 shows a schematic of the far-field distribution of an EUV focusing mirror in accordance with the invention.

FIG. 4 shows the far-field distribution when using the EUV focusing mirror in accordance with the invention in an EUV radiation source device. When the far-field distribution which is shown in the figure is compared to the far-field distribution when using a conventional EUV focusing mirror for an EUV radiation source device (see, FIGS. 7(a) and (b)), the degree of reduction of the light intensity is smaller than in the conventional case, even if regions with reduced light intensity are present isolated. In FIG. 4, the regions with reduced light intensity are regions which depend on the thickness of the tip areas of the knife edge parts on the radiation incidence and exit end of the respective Wolter mirrors b, c, d, e.

Figure 5:
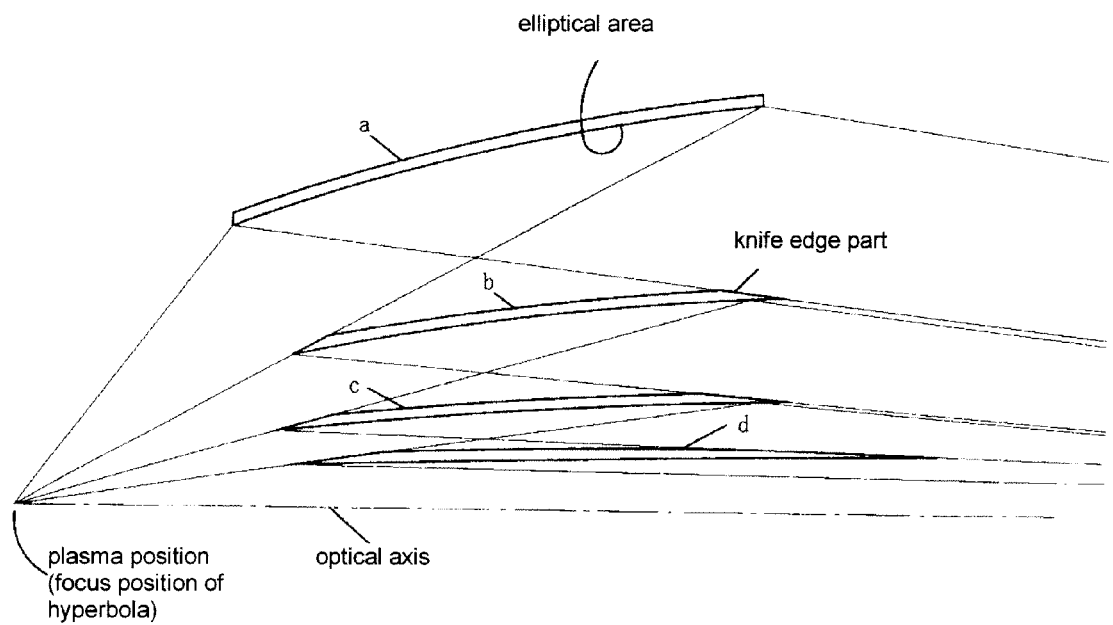
FIG. 5 shows a schematic of the case of using the invention for a focusing mirror in the form of an ellipsoid of revolution.
Figure 6:
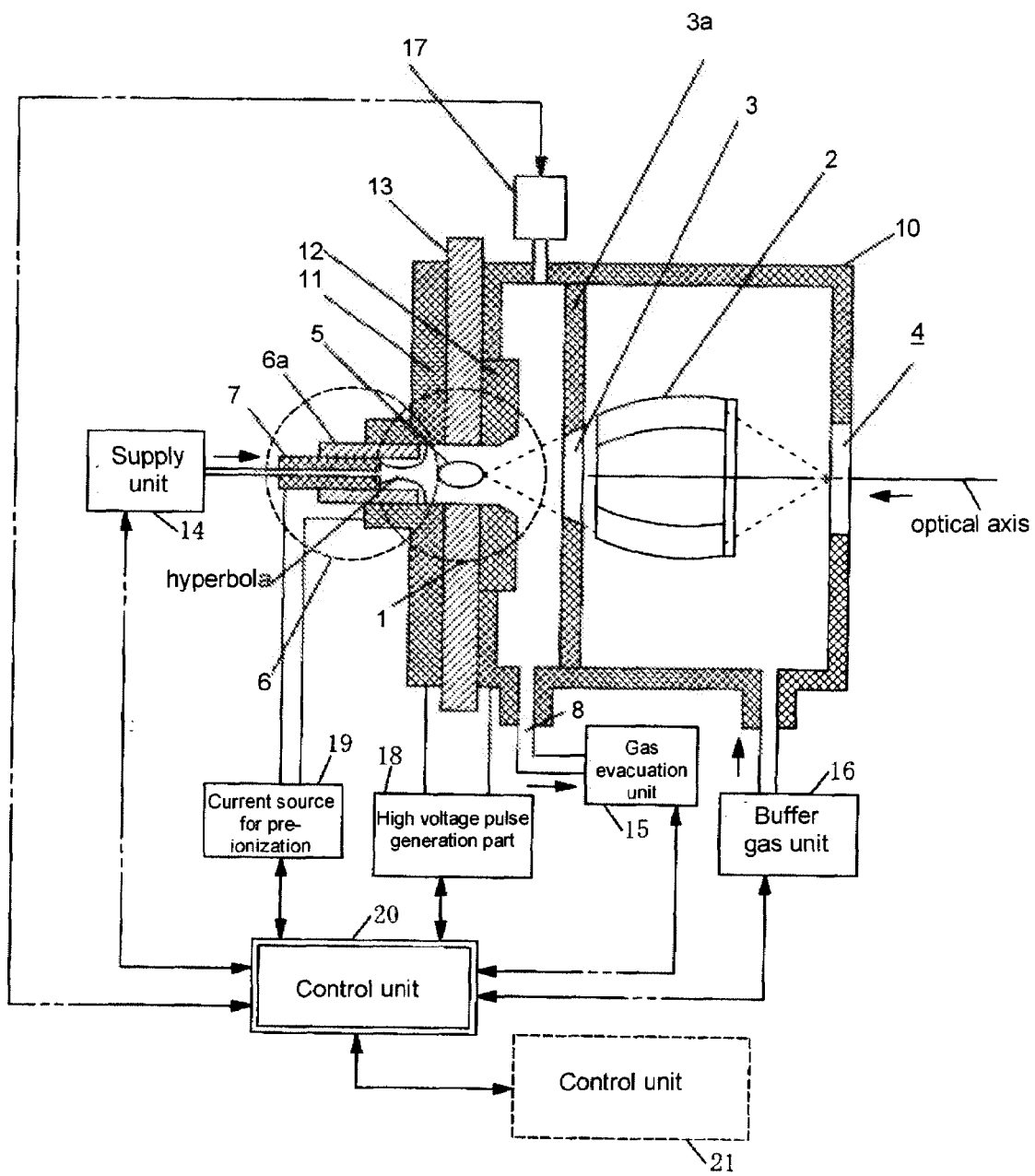
FIG. 6 shows a schematic of the arrangement of one example of a conventional EUV radiation source device of the DPP type.

FIG. 5 shows the arrangement of one example when using the invention for a focusing mirror in the form of an ellipsoid of revolution. FIG. 5 is a cross section of the focusing mirror through a plane through the optical axis. In FIG. 5 only the arrangement of the mirrors to one side with respect to the optical axis is shown, the mirrors being arranged symmetrically to the optical axis.

FIG. 5 shows that, for example, there are four nested mirrors a, b, c, d with different diameters. The reflection surfaces of the respective Wolter mirrors a, b, c, d are in the form of an ellipsoid.

In this embodiment, as in the above described embodiment, the ends on the sides of the respective mirrors b to d which do not constitute reflection surfaces, are made in the form of a knife edge at the radiation incidence side and the radiation exit side. In this way, it is possible to prevent the disadvantage that nonuniformity/scattering of the illuminance is formed by the shielded regions as a result of the thickness of the substrate material of the respective concave mirror on the workpiece.

In the case of a conventional EUV focusing mirror, for adequate cooling, a thickness of roughly 1 mm of the substrate material of the respective concave mirror of the EUV focusing mirror is needed. The grazing incident EUV radiation is shielded by this amount of thickness, as a result of which a region with an extremely reduced light intensity occurs for the far-field distribution. The nonuniformity of the illuminance on the workpiece is therefore increased.

On the other hand, in the case of an EUV focusing mirror in accordance with the invention, on the two ends of the respective concave mirror of the EUV focusing mirror there are knife edge parts. The bevel of the above described knife edge part is set such that the grazing incident EUV radiation is not shielded. Furthermore, the thickness of the tip of the knife edge part can be fixed to the μm order, therefore very thin. Therefore, the ratio of the shielding of the grazing incident EUV radiation from the ends of the respective concave mirror can be made very small, by which a reduction in the size of the region with a reduced light intensity occurs for the far-field distribution. As a result, it becomes possible to reduce the nonuniformity of the illuminance on the workpiece.

What we claim is:

1. Extreme UV radiation focusing mirror of the grazing incidence type, comprising a plurality of nested concave mirrors of different diameters, wherein a bevel is formed on ends of the concave mirrors at sides thereof which are not reflection surfaces.

2. Extreme UV radiation focusing mirror in accordance with claim 1, wherein the concave mirrors have a reflection surface of a shape selected from one of an ellipsoid of revolution, a paraboloid of revolution, and a Wolter shape, and wherein focus positions of the concave mirrors essentially coincide with one another.

3. Extreme UV radiation focusing mirror in accordance with claim 1, wherein the bevel has an angle on a radiation incidence side of the end of the concave mirrors that is a positive angle in a clockwise direction with respect to a direction of travel of incident extreme UV radiation.

4. Extreme UV radiation focusing mirror in accordance with claim 1, wherein the bevel has an angle on a radiation exit side of the end of the concave mirrors that is a negative angle in a clockwise direction with respect to a direction of travel of emerging extreme UV radiation.

5. Extreme UV radiation focusing mirror in accordance with claim 1, wherein the bevel has an angle on a radiation incidence side of the end of the concave mirrors that is a positive angle in a clockwise direction with respect to a direction of travel of incident extreme UV radiation, and wherein the bevel has an angle on a radiation exit side of the concave mirrors that is a negative angle in a clockwise direction with respect to a direction of travel of emerging UV radiation.

6. Extreme UV radiation source device, comprising:
a vessel;
a raw material supply means for supplying raw material to the vessel which contains at least one of an extreme UV radiation fuel and a compound of an extreme UV radiation fuel;
a means for heating and excitation which heats and excites the supplied raw material in the vessel and with which a plasma is produced that emits radiation containing extreme UV radiation;
a focusing optical system which is located in the vessel for focusing the radiation which has been emitted from the plasma; and
a radiation extracting part with which the focused radiation is extracted from the vessel,
wherein the focusing optical system comprises an extreme UV radiation focusing mirror formed of a plurality of nested concave mirrors of different diameters, and wherein a bevel is formed on ends of the concave mirrors at sides thereof which are not reflection surfaces.

7. Extreme UV radiation source device in accordance with claim 6, wherein the bevel has an angle on a radiation incidence side of the end of the concave mirrors that is a positive angle in a clockwise direction with respect to a direction of travel of incident extreme UV radiation.

8. Extreme UV radiation source device in accordance with claim 6, wherein the bevel has an angle on a radiation exit side of the end of the concave mirrors that is a negative angle in a clockwise direction with respect to a direction of travel of emerging extreme UV radiation.

9. Extreme UV radiation source device in accordance with claim 6, wherein the bevel has an angle on a radiation incidence side of the end of the concave mirrors that is a positive angle in a clockwise direction with respect to a direction of travel of incident extreme UV radiation, and wherein the bevel has an angle on a radiation exit side of the concave mirrors that is a negative angle in a clockwise direction with respect to a direction of travel of emerging UV radiation.

10. Extreme UV radiation source device in accordance with claim 6, wherein said bevels form knife edge parts at said ends of the convex mirrors.

11. Extreme UV radiation source device in accordance with claim 1, wherein said bevels form knife edge parts at said ends of the convex mirrors.

* * * * *